United States Patent
Yang et al.

(10) Patent No.: US 8,680,873 B2
(45) Date of Patent: Mar. 25, 2014

(54) METHOD AND APPARATUS FOR FAULT IDENTIFICATION IN A POWER TANSMISSION LINE

(75) Inventors: Ying Yang, Beijing (CN); Bin Su, Beijing (CN); Lei Jing, Beijing (CN); Qianjin Liu, Beijing (CN)

(73) Assignee: ABB Research Ltd., Zurich (CH)

(*) Notice: Subject to any disclaimer, the term of this patent is extended or adjusted under 35 U.S.C. 154(b) by 401 days.

(21) Appl. No.: 13/060,071

(22) PCT Filed: Aug. 29, 2008

(86) PCT No.: PCT/CN2008/072191
§ 371 (c)(1),
(2), (4) Date: Feb. 22, 2011

(87) PCT Pub. No.: WO2010/022559
PCT Pub. Date: Mar. 4, 2010

(65) Prior Publication Data
US 2011/0148430 A1 Jun. 23, 2011

(51) Int. Cl.
*G01R 31/02* (2006.01)
(52) U.S. Cl.
USPC .......................................... 324/543
(58) Field of Classification Search
USPC ............................... 324/543, 544
See application file for complete search history.

(56) References Cited

U.S. PATENT DOCUMENTS 6,525,543 B1* 2/2003 Roberts et al. ............... 324/522

OTHER PUBLICATIONS

Xu, "Research on Adaptive Single-pole Reclosing Technique for EHV/UHV Transmission Lines", Apr. 2008.*
Zhu, "Detection and Characterization of Oscillatory Transients Using Matching Pursuits with a damped Sinusoidal Dictionary", Mar. 2007.*
Li Bin et al, The Study on Single-pole Adaptive Reclosure of EHV Transmission Lines with the Shunt Reactor, Proceedings of the CSEE, May 2004, vol. 24, No. 5, pp. 52-56.
Wang Zengping et al, A New Criterion for Single-phase Adaptive Automatic Reclosure Based on Improved Correlation Algorithm, Proceedings of the CSEE, Apr., 2007, vol. 27, No. 10, pp. 49-55.
Lu Yan et al, Research on Adaptive Reclosure of EHV Transmission Lines with Shunt Reactors, Automation of Electric Power Systems, Mar. 25, 2008, vol. 32, No. 6, pp. 76-80.
ISA/CN, International Search Report re Application No. PCT/CN2008/072191, issued Jun. 4, 2009, 3 pp.

* cited by examiner

Primary Examiner — Arleen M Vazquez
Assistant Examiner — Feba Pothen
(74) Attorney, Agent, or Firm — Patrick J. Daugherty; Driggs, Hogg, Daugherty & Del Zoppo Co., LPA

(57) ABSTRACT

A method and apparatus for fault identification in a transmission line are provided. The method may include measuring at an end of the transmission line when the transmission line has a fault to obtain a measured signal, comparing the measured signal with a predefined standard signal, the predefined standard signal having beat frequency characteristic; and identifying that the fault is a transient fault if the measured signal matches the predefined standard signal according to a result of the comparison, or the fault is a permanent fault if the measured signal does not match the predefined standard signal according to the result of the comparison.

18 Claims, 7 Drawing Sheets

(a-t)

(b-t)

(a-p)

(b-p)

(T)

(P)

METHOD AND APPARATUS FOR FAULT IDENTIFICATION IN A POWER TANSMISSION LINE

RELATED APPLICATION

This application is a national filing of PCT application Serial No. PCT/CN2008/072191, filed Aug. 29, 2008.

FIELD OF INVENTION

The invention relates to the field of power transmission, and more particularly to a method for fault identification in a transmission line when the transmission line has a fault.

BACKGROUND OF THE INVENTION

For a transmission line, there generally exist two types of fault, i.e. permanent fault and temporary fault. And for HV/EHV system, over 90% of the faults are single-phase faults, and over 80% of the single-phase faults are temporary faults. Auto-reclosing is an effective way to improve the stability and continuity of a power system. However, if a transmission line with a permanent fault is auto-reclosed, there may be two risks, the first risk is that the primary devices may be damaged, and the second risk is that the system stability may be threatened. So it is very important to distinguish temporary faults from permanent faults in a transmission line.

For a transmission line without shunt reactors, a mutual and coupling voltage method is generally used. This method is based on the measuring of the voltage on an opened phase conductor. For a temporary single-phase fault, when the fault phase of a transmission line is isolated, the isolated phase conductor still possesses a voltage to ground, i.e. capacitive coupling voltage and inductive voltage from the unbroken healthy phase conductors. But for a permanent fault, the measured voltage mainly includes an inductive voltage from the unbroken healthy phase conductors, while the coupling voltage is nearly zero.

Long EHV/UHV transmission lines are often equipped with shunt reactors to compensate the distributed capacitance of the lines. A small reactor equipped between the neutral point of Y-connected reactors and the earth can partially compensate the phase-phase coupling capacitance. As a result, the power frequency capacitive coupling voltage may be very low in the case of either a permanent fault or a temporary fault. In this case, the methods based on the capacitive coupling voltage fail to distinguish a temporary fault from a permanent fault.

SUMMARY OF THE INVENTION

An embodiment of the invention provides a method for fault identification in a transmission line, so as to reliably distinguish a temporary fault (i.e. a transient fault) from a permanent fault in the case that a single-phase fault occurs in the transmission line and to avoid the reclosing of a circuit breaker when the fault is a permanent fault.

According to an embodiment of the invention, a method for fault identification in a transmission line is provided. The method may include the following steps of: measuring at an end of the transmission line when the transmission line has a fault to obtain a measured signal g(t), comparing the measured signal g(t) with a predefined standard signal f(t), the predefined standard signal f(t) having beat frequency characteristic; and identifying that the fault is a transient fault if the measured signal g(t) matches the predefined standard signal f(t) according to a result of the comparison, or the fault is a permanent fault if the measured signal g(t) does not match the predefined standard signal f(t) according to the result of the comparison.

According to another embodiment of the invention, an apparatus for fault identification in a transmission line is provided. The apparatus may include: a measurement unit, adapted to measure at an end of the transmission line when the transmission line has a fault to obtain a measured signal g(t), a comparison unit, adapted to compare the measured signal g(t) with a predefined standard signal f(t), the predefined standard signal f(t) having beat frequency characteristic; and an identification unit, adapted to identify that the fault is a transient fault if the measured signal g(t) matches the predefined standard signal f(t) according to a result of the comparison, or the fault is a permanent fault if the measured signal g(t) does not match the predefined standard signal f(t) according to the result of the comparison.

DESCRIPTION OF THE PREFERRED EMBODIMENTS

Exemplary embodiments of the present invention are described in conjunction with the accompanying drawings hereinafter. For the sake of clarity and conciseness, not all the features of actual implementations are described in the specification. However, it is to be appreciated that, during developing of any of such actual implementations, numerous implementation-specific decisions must be made to achieve the developer's specific goals, for example, compliance with system-related and business-related constraints which will vary from one implementation to another. Moreover, it is also to be appreciated that, such a development effort might be very complex and time-consuming, but may nevertheless be a routine task for those skilled in the art having the benefit of this disclosure.

For a line with shunt reactors, when there is a transient single-phase fault and a fault-phase circuit breaker is opened, the fault point will have a fault arcing, named as secondary arc. The variation of this arcing is an iterative process, i.e. at first the arcing becomes extinct, and then the arcing is reignited, and then the arcing becomes extinct again. This process will last some times and terminate when the voltage of the fault point is lower than the reigniting voltage of the fault arcing. When the fault arcing can not be reignited, the energy stored in fault phase conductor, such as capacitance, inductance, will be consumed in low frequency oscillating component if the fault is transient. But if the fault is permanent, the fault arcing has not reignited process, and the fault phase conductor can not store energy. So, in the case of a permanent fault, there is no oscillating wave.

Figure 1:
FIG. 1 illustrates a voltage measured at one end of opened phase conductor of a transmission line with shunt reactors in the case of a temporary fault.

Due to the oscillating component, the voltage measured at an end of the opened conductor may have a characteristic named as beat frequency in the case that a temporary fault occurs in the transmission line. FIG. 1 illustrates a voltage measured at one end of opened phase conductor of a transmission line with shunt reactors in the case of a temporary fault. The beat frequency characteristic means that the signal is a complex signal including two or more frequencies and its waveform is similar to section "4" as shown in FIG. 1.

In an embodiment of the invention, a standard signal waveform which has beat frequency characteristic is used to match and pursue a measured signal measured at one end of a transmission line, so as to distinguish a transient fault from a permanent fault by comparison between the measured signal and the standard signal.

Figure 2:
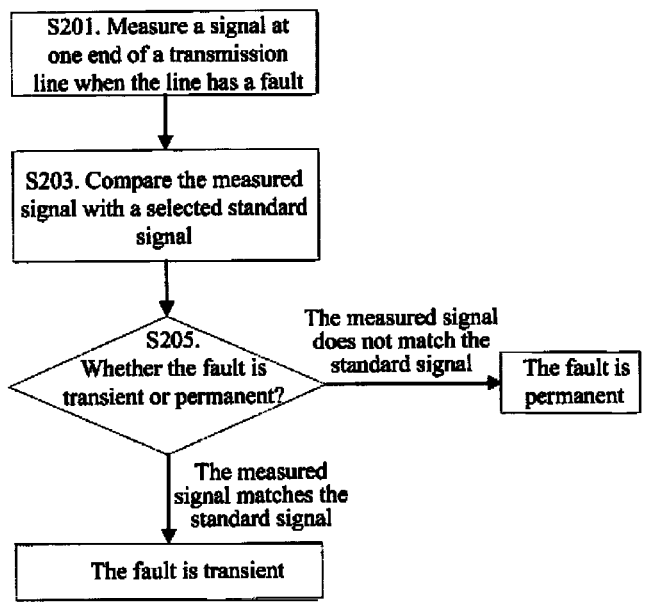
FIG. 2 illustrates a flow chart of a method for fault identification in a transmission line according to an embodiment of the invention.

FIG. 2 illustrates a flow chart of a method for fault identification in a transmission line according to an embodiment of the invention.

As shown in FIG. 2, in step 201 when a fault occurs in a transmission line, a signal g(t) (e.g. a voltage or a current) is measured at one end of the transmission line. In step 203, a standard signal f(t) which has beat frequency characteristic is selected, and the measured signal g(t) is compared with the standard signal f(t).

In step 205, it is determined whether the fault is a transient fault or a permanent fault according to the comparison result. If the comparison result shows that the measured signal matches the standard signal, the fault is determined to be a transient fault, otherwise, it is a permanent fault.

Figure 3:
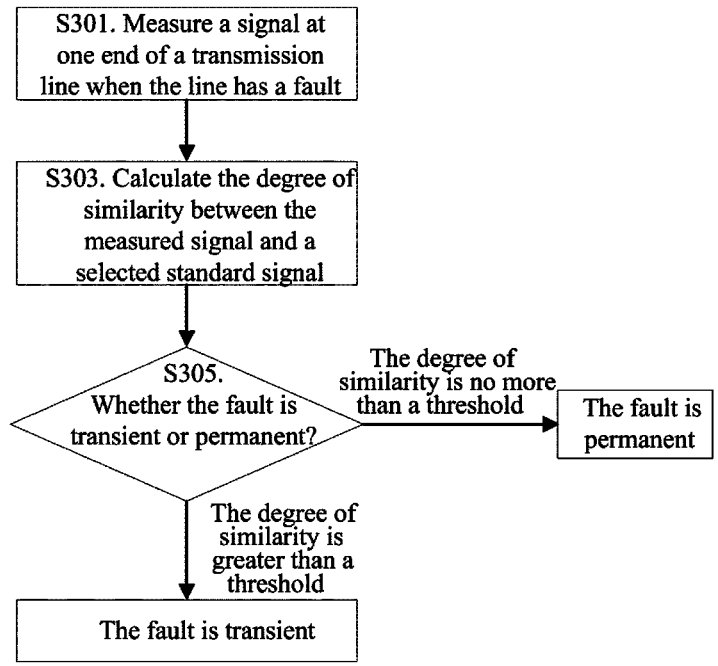
FIG. 3 illustrates a flow chart of a method for fault identification in a transmission line according to another embodiment of the invention.

FIG. 3 illustrates a flow chart of a method for fault identification in a transmission line according to another embodiment of the invention. The step 301 is similar to step 201 as shown in the above embodiment. In step 303, a degree of similarity between the measured signal g(t) and the standard signal f(t) is calculated. As an example, the degree of similarity may be obtained by calculating the inner product of the signal f(t) and the measured signal g(t) calculated according to the following equation (1):

$$K = \frac{\langle g(t), f(t) \rangle}{\|g(t)\|_2 \|f(t)\|_2}, \quad \text{Equation (1)}$$

$$K \in [-1, 1]$$

In the equation (1), K is an interrelated coefficient, and its value represents the degree of similarity between the measured signal g(t) and the standard signal f(t).

In step 305, it is determined whether the fault is a transient fault or a permanent fault according to the calculated degree of similarity. If the value of the coefficient K is over a preset threshold, a decision can be done that the measured signal matches the standard signal. In other words, it can be determined that the fault of the transmission line is a transient fault (i.e. a temporary fault). Otherwise, it can be determined that the measured signal does not match the standard signal, and accordingly the fault is a permanent fault.

The following expression (2) is an example of a criterion for distinguishing a transient fault from a permanent fault based on the calculated degree of similarity.

$$\left. \begin{array}{ll} \text{if} & K > Thres \\ \text{then} & \text{transient fault is true} \\ \text{else} & \text{permanent fault is true} \end{array} \right\} \quad \text{Expression (2)}$$

Where "Thres" represents a preset threshold, which can be adjusted based on the different requirements of the user. That is to say, if the re-closing of a fault-line is not permitted, 'Thres' can be assigned a higher value, e.g. '10', otherwise, it should be assigned a lower value, e.g. '0.1'. Generally, the threshold can be set to '1'.

Figure 4:
FIG. 4 illustrates an example of a standard signal, selected from the wave as shown in FIG. 1, according to an embodiment of the invention.
Figure 5:
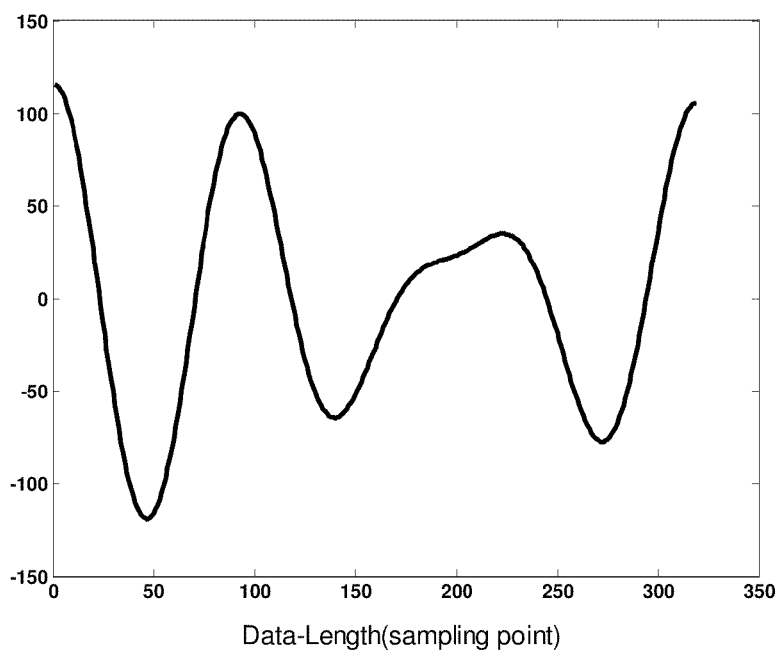
FIG. 5 illustrates another example of a standard signal according to an embodiment of the invention.

Since the characteristic of a temporary fault is known, the standard signal can be selected by selecting a waveform which including a full beat frequency wave similar to, for example, those as shown in FIG. 4 and FIG. 5.

FIG. 4 illustrates an example of the standard signal, selected from the wave as shown in FIG. 1. FIG. 5 illustrates another example of the standard signal. It should be noted that the standard signal may be selected randomly, on the precondition that the standard signal has the beat frequency characteristic. The matching pursuit result is uniform. It will be appreciated by a person of ordinary skill in the art that, the standard signal should not be construed as limited to the waves as shown in FIG. 4 and FIG. 5.

Some particular implementations of the method according to the embodiment of the invention are described below, using the wave as shown in FIG. 5 as a standard signal exemplarily.

Implementation 1

Figure 6:
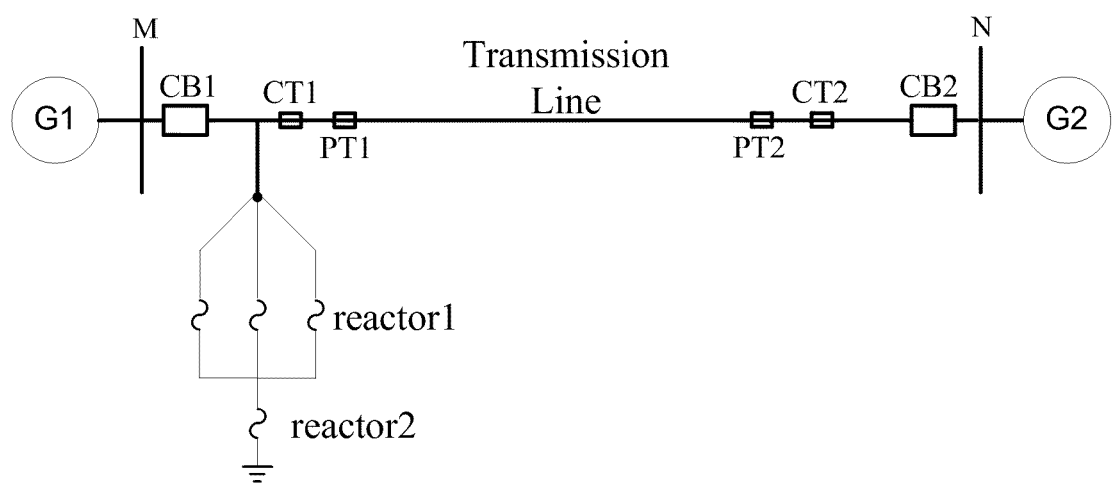
FIG. 6 illustrates a structure of a transmission line with shunt reactors at one end of the transmission line.

FIG. 6 illustrates a structure of a transmission line with shunt reactors at one end. As shown in FIG. 6, G1 and G2 represent generator units, M and N represent buses, CB1 and CB2 represent circuit breakers, and PT1 and PT2 represent voltage transformers. As shown, the voltage transformer PT1 and PT2 are installed at the line side. A small reactor, i.e. reactor2, is positioned between the neutral point of Y-connected reactors, i.e. reactor1, and the earth.

Figure 7:
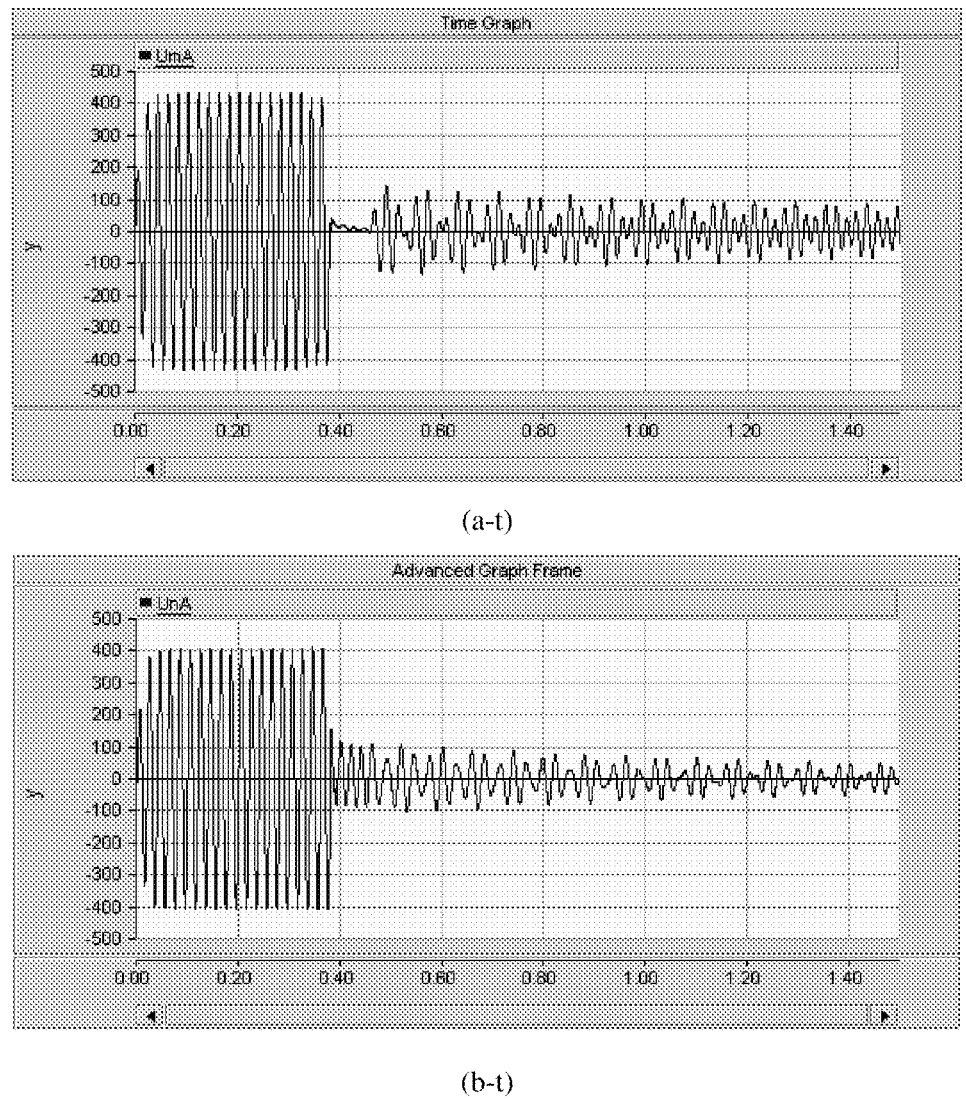
FIG. 7 and FIG. 8 illustrate some simulation results based on the structure as shown in FIG. 6 within the simulation circumstance—PSCAD (Power Systems Computer Aided Design)
Figure 8:
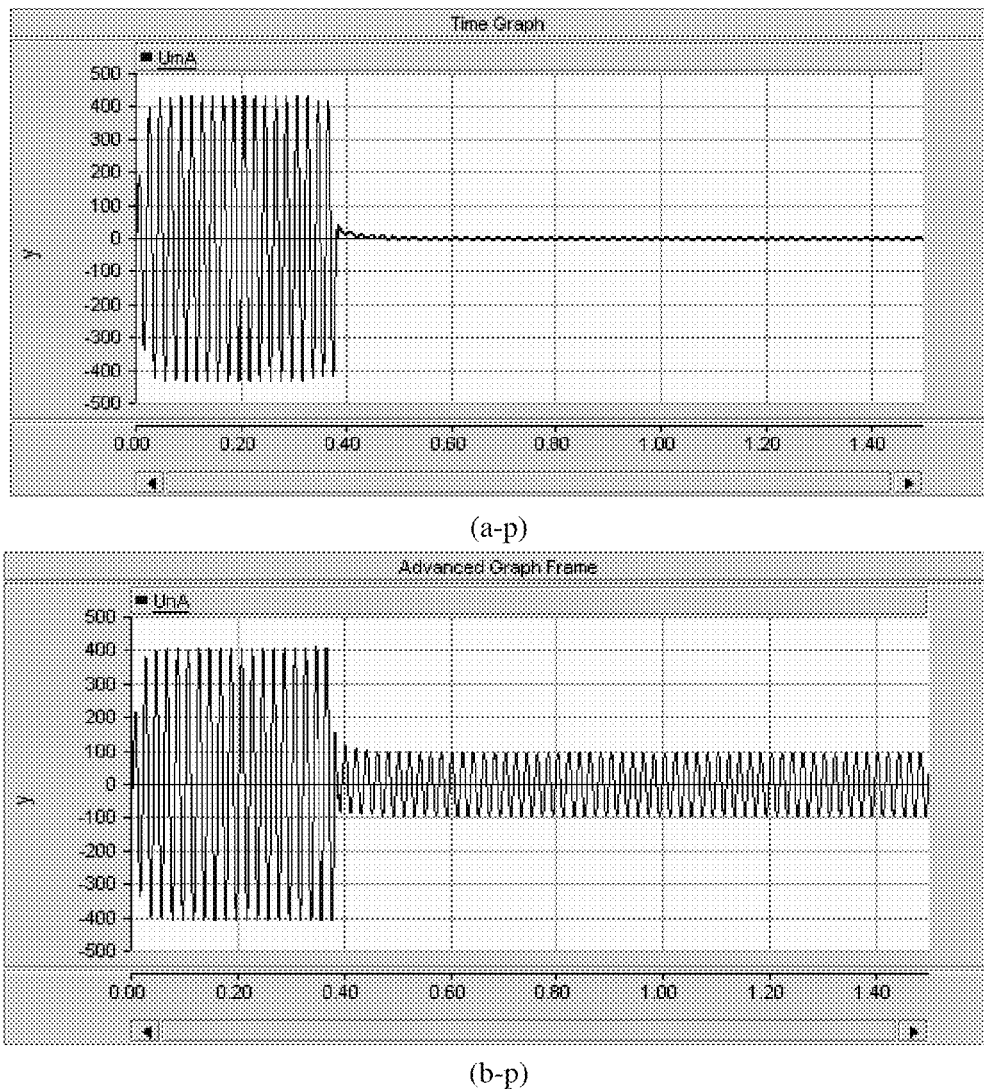

FIG. 7 and FIG. 8 show some simulation results with the simulation tool, i.e. PSCAD (Power Systems Computer Aided Design), based on the signal as shown in FIG. 5. FIG. 7 (a-t) and (b-t) illustrate the A-phase measured voltage at the ends M and N respectively, in the case of a transient fault. FIG. 8 (a-p) and (b-p) illustrate the A-phase measured voltage at the ends M and N respectively, in the case of a permanent fault.

Figure 9:
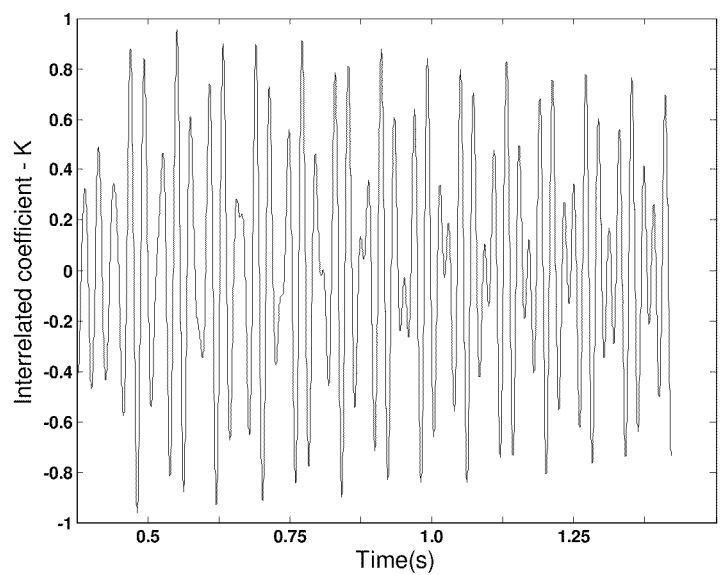
FIG. 9 illustrates the values of a coefficient K calculated based on an equation (1) described below according to an embodiment of the invention.
Figure 9:
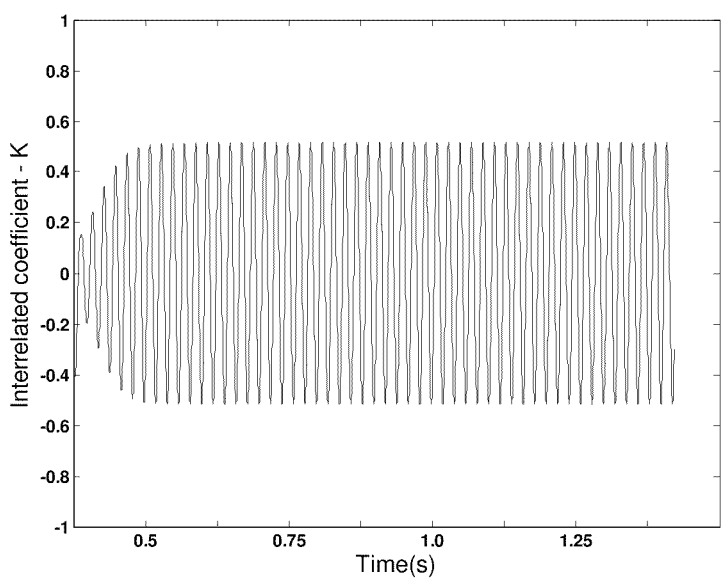

FIG. 9 illustrates the values of the coefficient K calculated based on the above described equation (1), in which FIG. 9 (T) shows the calculated values in the case of a temporary fault and FIG. 9 (P) shows the calculated values in the case of a permanent fault.

In this implementation, the measured signal is the voltage measured at an end of the transmission line. However, the calculation of the values of the coefficient K utilizes, for example, only the data from 0.5 s to 1.5 s, whose length should larger than that of the standard signal.

It should be noted that, in the matching pursuit method, the coefficient needs to be calculated point by point continuously.

For example, if the measured signal is set to g(1:1000), in which "1:1000" means that the signal data window for the measured signal is from the sampling data index 1 to 1000, and the standard signal is set to f(1:300), in which "1:300" means that the signal data window for the standard signal is from the sampling data index is to 300 (the meanings of "2:301", and "701:1000", etc. illustrated below are similar, the description of which is omitted below), the first calculation is to multiply g(1:300) by f(1:300), and the second calculation is to multiply g(2:301) by f(1:300), and the rest can be deduced by analogy until data g(701:1000) is multiplied.

It can be seen from FIG. 9 that, when the fault is a transient type, the coefficient K has a maximum value which is over 0.9, while for a permanent fault, the coefficient K has a maximum value lower than 0.6.

Implementation 2

Figure 10:
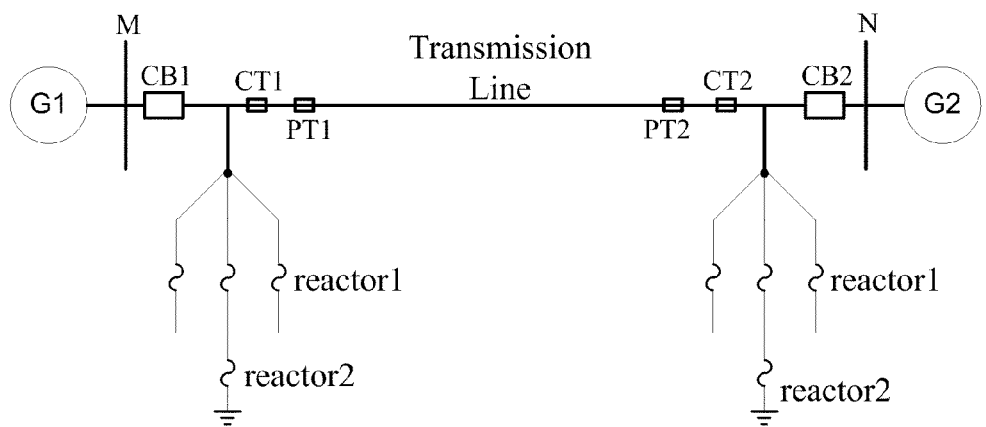
FIG. 10 illustrates a structure of a transmission line with shunt reactors at both ends of the transmission line.

FIG. 10 illustrates a structure of a transmission line with shunt reactors at both ends of the transmission line. Since there is no difference between the fault characteristic of this structure and that shown in FIG. 6, the simulation result is not shown herein.

As can be seen from the simulation results in the above implementations, the calculated coefficients K are generally lower than 0.6 in the case of a permanent fault, so in this example the threshold can be set to 0.6, or, the threshold can be set to 0.72, or 1.2, etc.

The above criterion as shown in the expression (2) is simple. It depends on only the characteristic of a beat frequency signal (e.g. a voltage or a current). Accordingly, the above criterion is immune to fault resistance to earth, and is independent of the amplitude of a beat frequency signal.

In addition, as can be seen from the simulation results shown in FIG. 9, the envelope-amplitude of the calculated values of coefficient K exhibits a significant fluctuate in the case of an arc fault (i.e. a temporary fault), as shown in FIG. 9 (T), and exhibits a horizontal line in the case of a permanent fault, as shown in FIG. 9 (P). In an embodiment of the invention, this characteristic in the envelope-amplitude of the values of the coefficient K is utilized in fault identification. That is, if the envelope-amplitude of the values of the coefficient K exhibits a significant fluctuate, it can be determined that the fault is a transient fault, otherwise, the fault is a permanent fault. By utilizing the characteristics, the method may be applied to power grids with different frequencies. For example, the system frequency of the power grid in China is 50 Hz, while the frequency in Europe is 60 Hz. In addition, the frequency usually has small excursion, and the conditions of the grid system may vary from time to time. In such a case, by utilizing the characteristic of the envelope-amplitude mentioned above, the method for fault identification in a transmission line may exhibits a good performance, though the standard signal is selected randomly. In this way, the performance of the method for fault identification may be improved.

In another embodiment of the invention, a current measured at one end of the transmission line in the case of a fault may also be used as a measured signal to be matched with a standard signal, to identify whether the fault is a transient fault or a permanent fault.

The performance of the invention depends on only the beat frequency characteristic, and is independent of the amplitude of the measured voltage/current. In addition, the beat frequency characteristic depends on only the configuration of the transmission line.

In the embodiments described above, the fault occurring in the transmission line is a single-phase fault. In other embodiments, the method as described above can also be used for three-phase trip of a line with shunt reactor.

Figure 11:
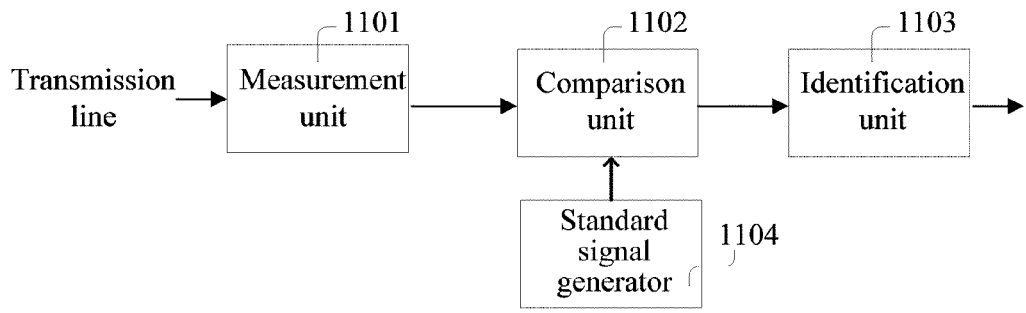
FIG. 11 illustrates a fault identification apparatus according to an embodiment of the invention.

FIG. 11 illustrates a fault identification apparatus which may be applied to identify a fault in a transmission line according to an embodiment of the invention. As shown in FIG. 10, the fault identification apparatus includes a measurement unit 1101, a comparison unit 1102 and an identification unit 1103.

The measurement unit 1101 is adapted to measure at an end of a transmission line when the transmission line has a fault to obtain a measured signal g(t), which may be for example, a voltage signal or a current signal measured at the end of the transmission line. The comparison unit 1102 is adapted to compare the measured signal g(t) with a predefined standard signal f(t). The predefined standard signal f(t) has beat frequency characteristic. The identification unit 1103 is adapted to identify whether the fault is permanent or transient according to the comparison result output from the comparison unit. It may be determined that the fault is a transient fault if the measured signal g(t) matches the predefined standard signal f(t), or the fault is a permanent fault if the measured signal g(t) does not match the predefined standard signal f(t).

Optionally, the comparison unit 1102 is further adapted to calculate a degree of similarity K between the measured signal g(t) and a predefined standard signal f(t). The identification unit 1103 is further adapted to determine whether the fault is a transient fault or a permanent fault according to the calculated value of the degree of similarity K. For example, the fault is determined to be a transient fault if the value of the degree of similarity K exceeds a threshold. As an example, the degree of similarity K may be calculated according to the equation (1) described above. The comparison and identification may be performed by the fault identification apparatus using the methods described above.

The standard signal is selected randomly on the precondition that the standard signal has the beat frequency characteristic. Optionally, the fault identification apparatus may further comprise a standard signal generator 1104 adapted to generate the standard signal having the beat frequency characteristic randomly and output the generated standard signal to the comparison unit.

In addition, it should be noted that, the above processes and apparatus may be implemented by software and/or firmware. In case of implementing them by software and/or firmware, a program constituting the software may be installed into a computer with dedicated hardware, for example, a general-purpose personal computer, and the computer is capable of performing various functions if with various programs installed therein.

Furthermore, it is noted herein that, in order to avoid obscuring the present invention due to unnecessary details, the drawings only show device structures and/or processing steps closely related to the solutions according to the present invention and other details little related to the present invention are omitted.

Finally, it is also noted that, in this disclosure, relational terms such as left and right, first and second, and the like are used merely to distinguish one entity or action from another entity or action without necessarily requiring or implying any actual such relationship or order between such entities or actions. Moreover, the terms "comprise", "comprising," "include" or any other variations thereof, are intended to cover a non-exclusive inclusion so that a process, method, article, or device that comprises a list of elements does not only include these elements but also may include other elements not explicitly listed or inherent to such process, method, article, or device. An element preceded by "a" or "an" does not, without more constraints, preclude the existence of additional identical elements in the process, method, article, or device that comprises the element.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

What is claimed is:

1. A method for fault identification in a transmission line, the method comprising:
   in response to an occurrence of a fault on a transmission line, measuring at an end of the transmission line a signal over time to obtain a measured signal defining a waveform of zero and non-zero values;
   comparing the measured signal with a predefined standard signal over a signal data window length of time to determine values of an amount of similarity between respective waveforms of the measure signal and the predefined standard signal over the signal data window length of time, wherein the signal data window length of time is selected to be longer than length of time of a beat frequency characteristic waveform of the predefined standard signal that has zero and non-zero values;
   determining that the fault is a transient fault if the degree of similarity values exceed a threshold; and
   determining that the fault is a permanent fault if the degree of similarity values do not exceed the threshold.

2. The method of claim 1, wherein the degree of similarity between the measured signal and the predefined standard signal is a coefficient value K that is calculated by the following equation:

$$K = \frac{\langle g(t), f(t) \rangle}{\|g(t)\|_2 \|f(t)\|_2};$$

$$K \in [-1, 1]$$

wherein t is the signal data window length of time, g(t) is a value of the measured signal over the signal data window length of time, and f(t) is a value of the predefined standard signal over the signal data window length of time.

3. The method of claim 1, wherein the measured signal is a voltage signal or a current signal measured at the end of the transmission line.

4. The method of claim 1, wherein the predefined standard signal is selected randomly on a precondition that the predefined standard signal has the beat frequency characteristic over the signal data window length of time.

5. The method of claim 1, wherein the fault is a single-phase fault.

6. The method of claim 1, further comprising:
   determining that the fault is the transient fault if maximum values of a waveform of the determined values of the amount of similarity between the measured signal and the predefined standard signal fluctuate over the signal data window length of time; and
   determining that the fault is the permanent fault if the maximum values of the waveform of the determined values of the amount of similarity between the measured signal and the predefined standard signal do not fluctuate over the signal data window length of time.

7. The method of claim 1, wherein the threshold is set to 1.

8. The method of claim 1, wherein the threshold is set to 10.

9. The method of claim 1, wherein the threshold is set to 0.1.

10. An apparatus for fault identification in a transmission line, the apparatus comprising:
    a measurement unit configured to measure at an end of the transmission line, when the transmission line has a fault, to obtain a measured signal defining a waveform of zero and non-zero values;
    a comparison unit configured to compare the measured signal with a predefined standard signal over a signal data window length of time to determine values of an amount of similarity between respective waveforms of the measured signal and the predefined standard signal over the signal data window length of time, wherein the signal data window length of time is selected to be longer than length of time of a beat frequency characteristic waveform of the predefined standard signal that has zero and non-zero values; and
    an identification unit configured to identify that the fault is a transient fault if the degree of similarity values exceed a threshold, or that the fault is a permanent fault if the degree of similarity values do not exceed the threshold.

11. The apparatus of claim 10, wherein the degree of similarity between the measured signal and the predefined standard signal is a coefficient value K that is calculated by the following equation:

$$K = \frac{\langle g(t), f(t) \rangle}{\|g(t)\|_2 \|f(t)\|_2};$$

$$K \in [-1, 1]$$

wherein t is the signal data window length of time, g(t) is a value of the measured signal over the signal data window length of time, and f(t) is a value of the predefined standard signal over the signal data window length of time.

12. The apparatus of claim 10, further comprising a standard signal generator configured to generate the standard signal having the beat frequency characteristic randomly.

13. The apparatus of claim 10, wherein the measured signal is a voltage signal or a current signal measured at the end of the transmission line.

14. The apparatus of claim 10, wherein the threshold is set to 1.

15. The apparatus of claim 10, wherein the threshold is set to 10.

16. The apparatus of claim 10, wherein the threshold is set to 0.1.

17. The apparatus of claim 10, wherein the fault is a single-phase fault.

18. The apparatus of claim 10, wherein the fault is determined to be the transient fault if maximum values of a waveform of the determined values of the amount of similarity between the measured signal and the predefined standard signal fluctuate over the signal data window length of time, and as the permanent fault if the maximum values of the waveform of the determined values of the amount of similarity between the measured signal and the predefined standard signal do not fluctuate over the signal data window length of time.

* * * * *